United States Patent
Melik-Martirosian et al.

(10) Patent No.: US 6,894,932 B1
(45) Date of Patent: May 17, 2005

(54) DUAL CELL MEMORY DEVICE HAVING A TOP DIELECTRIC STACK

(75) Inventors: Ashot Melik-Martirosian, Santa Clara, CA (US); Mark W. Randolph, San Jose, CA (US); Sameer S. Haddad, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 10 days.

(21) Appl. No.: 10/716,230

(22) Filed: Nov. 18, 2003

(51) Int. Cl.[7] .............................................. G11C 16/04

(52) U.S. Cl. ........................... 365/185.28; 365/185.18; 365/185.29

(58) Field of Search .................... 365/185.28, 185.18, 365/185.29, 185.33

(56) References Cited

U.S. PATENT DOCUMENTS 6,690,601 B2 * 2/2004 Yeh et al. .............. 365/185.28

* cited by examiner

*Primary Examiner*—David Lam
(74) *Attorney, Agent, or Firm*—Renner, Otto, Boisselle & Sklar, LLP (57) ABSTRACT

A non-volatile memory device includes a semiconductor substrate and a pair of buried bitlines within the substrate. A bottom dielectric layer is formed over the substrate and a charge trapping dielectric layer is formed over the bottom dielectric layer. A multi-layer top dielectric stack is formed over the charge trapping dielectric layer. The top dielectric stack includes a first oxide layer, a nitride layer, and a second oxide layer. A wordline is formed over the top dielectric stack. The multi-layer top dielectric stack has a reduced electrical thickness, thereby providing a memory device, which is operative to be programmed using a reduced operating voltage of less than about +8 Volts.

20 Claims, 4 Drawing Sheets

Prior Art

DUAL CELL MEMORY DEVICE HAVING A TOP DIELECTRIC STACK

TECHNICAL FIELD

The present invention relates generally to the field of non-volatile memory devices and, more particularly, to a charge trapping dielectric flash electrically erasable and programmable memory device having an electrically scaled top dielectric stack and a reduced programming voltage.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, is capable of storing two bits of data in a double-bit arrangement. That is, one bit can be stored using a first charge storing region on a first side of the memory device and a second bit can be stored using a second charge storing region on second side of the memory device.

Figure 1:
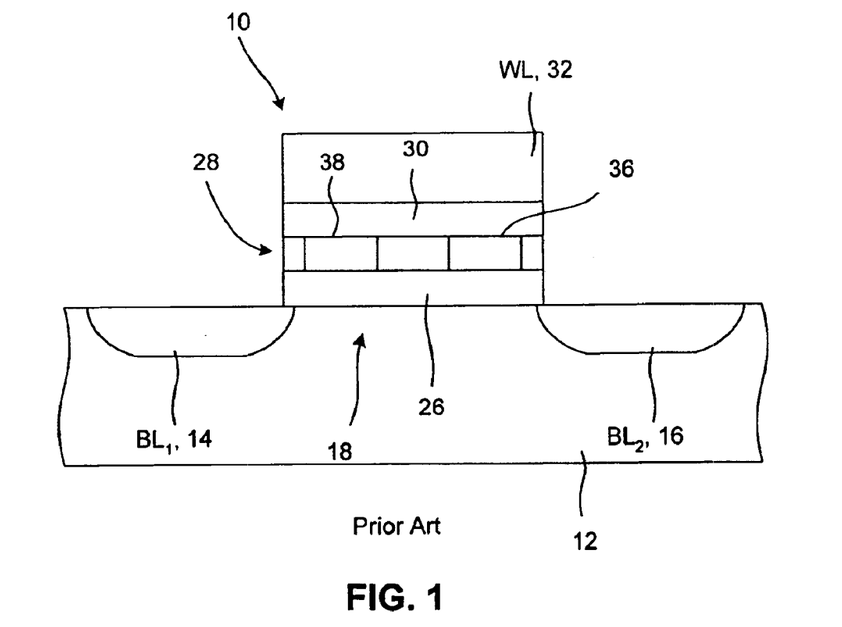
FIG. 1 is a schematic cross-section illustration of a conventional flash memory device.

As shown in FIG. 1, in a conventional charge trapping dielectric memory device 10, the charge storing regions 36, 38 are part of a non-conductive charge trapping layer 28 that is disposed between a relatively thick (e.g., about 100 angstroms) bottom (or tunnel) dielectric layer 26 and a relatively thick (e.g., 100 angstroms) top dielectric layer 30. These dielectric layers 26, 28, 30 can be formed over a P-type conductivity silicon substrate 12 having a series of bitlines $BL_1$, $BL_2$, disposed therein. A series of conductive wordlines WL made from polycrystalline silicon is formed over the dielectric layers 26, 28, 30 for serving as a gate electrode 32 for each memory device 10. The core memory devices 10 can be addressed by applying appropriate voltages to the wordline WL and/or bitlines $BL_1$, $BL_2$.

During programming and reading of the core memory devices 10, the bitlines $BL_1$, $BL_2$ can function as a source 14 (i.e., a source of electrons or holes) and a drain 16 with an active channel region defined therebetween. Programming of such a memory device can be accomplished, for example, by hot electron injection. Hot electron injection involved applying appropriate voltage potentials to each of the gate electrode 32, the source 14, and the drain 16 of the memory device 10 for a specified duration until the charge trapping layer 28 accumulates charge.

Where possible, it is desirable to downscale memory devices, while still maintaining desirable qualities, such as adequate data retention, and optimizing performance. However, memory device downscaling can result in a number of performance degrading effects. For example, in memory devices with an active channel region having a relatively short length, a memory device can experience a number of undesirable electrical characteristics referred to as short channel effects (SCE). SCE generally occur when the gate electrode does not have adequate control over the active channel region, and can include threshold voltage ($V_T$) roll off, off current ($I_{off}$) roll-up and drain induced barrier lowering (DIBL). As the physical dimensions of the device decrease, SCE can be become more severe.

Where possible, it is also desirable to reduce the amount of power used to operate (e.g., program, read and/or erase) memory devices.

Accordingly, there is a need in the art for improved memory devices, such as charge trapping dielectric flash memory devices, that optimize scale, power consumption and performance.

SUMMARY OF THE INVENTION

According to one aspect of the invention, the invention is directed to a memory device. The memory device can include a substrate having a first semiconductor bitline and a second semiconductor bitline formed therein and a body region interposed between the first and second bitlines. A bottom dielectric layer can be disposed over the body region and a non-conductive charge trapping layer, which is operatively configured to have at least two independent charge storing regions, can be disposed over the bottom dielectric layer. A top dielectric stack, which can include at least three dielectric layers, can be disposed over the charge trapping layer. A wordline, which electrically defines a channel within the body region, can be disposed over the top dielectric stack.

According to another aspect of the invention, the invention is directed to a memory device. The memory device can include a semiconductor substrate and a source and a drain, which each can be formed from buried bitlines disposed within the semiconductor substrate. The source and drain can define a body region therebetween. A charge trapping dielectric stack, which can have at least five dielectric layers, including a non-conductive charge trapping layer, can be formed over the body region. A gate electrode, which can electrically define a channel within the body region, can be formed from a wordline disposed over the dielectric stack.

According to another aspect of the invention, the invention is directed to a method of programming a non-volatile memory device. The memory device can include a pair of buried bitlines disposed within a semiconductor substrate. The buried bitlines can define a body region therebetween. The memory device can include a bottom dielectric layer formed over the body region and a charge storing layer formed over the bottom dielectric layer. The charge storing layer can have conductivity such that at least a first charge can be stored in a first charge storing cell adjacent a first buried bitline and at least a second charge can be stored in a second charge storing cell adjacent a second buried bitline. A top dielectric stack, which includes at least three dielectric layers, can be formed over the charge storing layer and a wordline can be formed over the top dielectric stack. One method of programming can include applying a program voltage of less than +8 Volts to the wordline and applying a voltage potential of about +3 Volts to about +5 Volts to the first bitline, and connecting the second bitline to a zero potential.

According to another aspect of the invention, the invention is directed to a method of erasing a non-volatile memory device. One method of erasing can include applying an erase voltage of about −3 Volts to about −5 Volts to the wordline. This method can further include either (i) applying a voltage potential of about +4 Volts to about +5 Volts to the first bitline, while floating the second bitline or (ii) applying a voltage potential of about +4 Volts to about +5 Volts to both the first and the second bitlines.

Another method of erasing can include either (i) applying an erase voltage of about −12 Volts to about −15 Volts to the wordline, while connecting the body, the first, and the second bitlines to a zero potential or (ii) applying an erase voltage of about −8 Volts to about −10 Volts to the wordline, while applying a potential of about +4 Volts to about +6 Volts to the substrate, the first, and the second bitlines.

BRIEF DESCRIPTION OF DRAWINGS

These and further features of the present invention will be apparent with reference to the following description and drawings, wherein.

DISCLOSURE OF INVENTION

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

Figure 2:
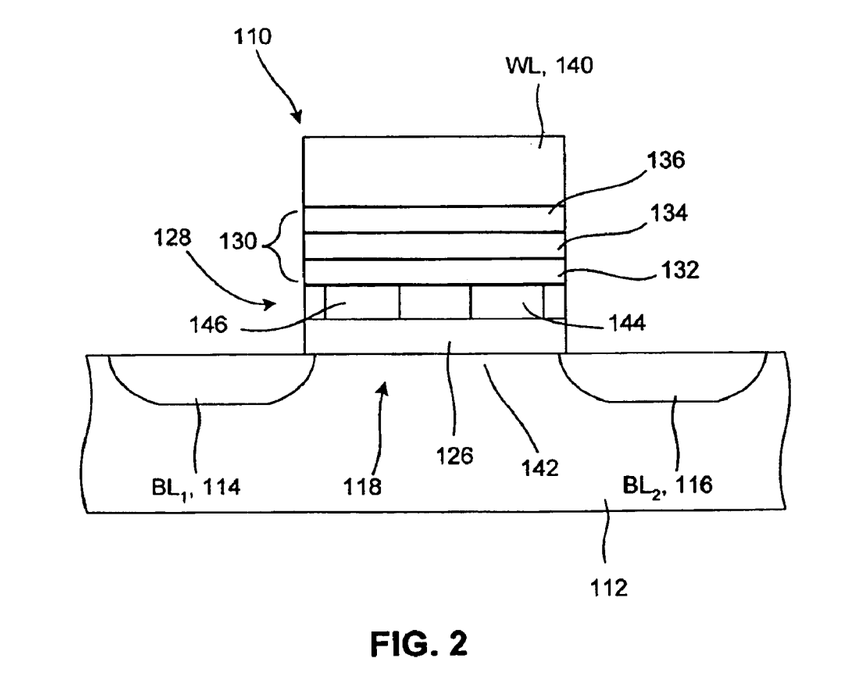
FIG. 2 is a schematic cross-section illustration of a flash memory device having a multi-layer top dielectric stack in accordance with the present invention.

With reference to FIG. 2, an exemplary multiple-bit, charge trapping dielectric, non-volatile, flash electrically erasable and programmable memory device 110 is illustrated. The memory device 110 includes a semiconductor substrate 112. In one embodiment, the substrate 112 can initially be doped to have P-type conductivity (i.e., P dopant concentration). A pair of buried bitlines $BL_1$, $BL_2$ can be formed within the substrate 112. Each buried bitline $BL_1$, $BL_2$ can be doped to have an N-type conductivity (e.g., $N^+$ dopant concentration). In one embodiment, each buried bitline $BL_1$, $BL_2$ functions as a source 114 and a drain 116, respectively, during various programming, reading, and erasing operations. Alternatively, the source 114 and the drain 116 an be coupled to corresponding bitlines.

A body 118 is formed between the source 114 and the drain 116. The body 118 can have the same dopant type and concentration as the initial doping of the substrate 112. The substrate 112, the source 114, the drain 116 and the body 118 can be formed, for example, from a semiconductor such as appropriately doped silicon, germanium or silicon-germanium.

Above the body 118 is a first dielectric layer 126 (also referred to as a tunneling dielectric layer or a bottom dielectric layer) that is made from, for example, silicon oxide (e.g., $SiO_2$), other standard-K material (e.g., having a relative permittivity below ten) or a high-K material (e.g., having a relative permittivity, in one embodiment, above ten and, in another embodiment, above twenty).

Over the bottom dielectric layer 126 is a charge trapping layer 128 (also referred to as a charge storing layer). The charge trapping layer 128 can be made from, for example, a non-conductive material, including silicon nitride ($Si_3N_4$), silicon oxide with buried polysilicon islands, implanted oxide and the like.

Over the charge trapping layer 128 is a multi-layer top dielectric stack 130. In one embodiment, the top dielectric stack 130 can include three layers of dielectric material. For example, the top dielectric stack 130 can include a first dielectric layer 132 made from a material such as, for example, silicon oxide (e.g., $SiO_2$), another standard-K material or a high-K material. Over the first dielectric layer 132 a second dielectric layer 134 can be formed from a material such as, for example, silicon nitride ($Si_3N_4$) or aluminum oxide ($Al_2O_3$). Over the second dielectric layer 134 is a third dielectric layer 136 made from a material such as, for example, silicon oxide (e.g., $SiO_2$). In one embodiment, the top dielectric stack 130 can be made up of an ONO (oxide-nitride-oxide) stack. Alternatively, the top dielectric stack 130 can be made or of an OAO (oxide-$Al_2O_3$-oxide) stack. It is to be appreciated that the multi-layer top dielectric stack 130 can include greater or less than three dielectric layers without departing from the scope of the present invention.

Over the top dielectric stack 130, a wordline WL is formed. In one embodiment, the wordline WL functions as a gate electrode 140, which, in part, controls a channel 142 interposed between the bitlines $BL_1$, $BL_2$. In alternative arrangements, the wordline WL can be formed from interconnected polysilicon gate electrode 140 islands or pads. A work function of the gate electrode 140 controls the channel 142 (e.g., inversion or depletion states) within the body 118. The wordline WL and/or gate electrode can be made from, for example, polycrystalline silicon (poly) or another appropriate material, such as a metal or metal oxide. Optionally, sidewall spacers (not shown) can be disposed adjacent lateral sidewalls of the gate electrode 140, the top dielectric stack 130, the charge trapping layer 128 and the bottom dielectric layer 126 for use in controlling dopant implantation device properties and the like.

The multi-layer dielectric stack 130 of a given physical thickness has an effective electrical thickness that is less than the effective electrical thickness of a single oxide layer of the same physical thickness. For example, in one embodiment, an ONO multi-layer top dielectric stack including a first oxide layer of about 20 angstroms of thickness, a nitride layer of about 40 angstroms of thickness, and a second oxide layer of about 20 angstroms of thickness, would have a physical thickness of about 80 angstroms, but would have an effective electrical thickness equivalent to that of a single oxide layer of about 60 angstrom of thickness. Thus, the above-described exemplary ONO stack would have an EOT (Equivalent Oxide Thickness) of about 60 angstroms. The difference between the physical thickness and the EOT of the ONO stack arises from the fact that the dielectric constant of silicon nitride ($Si_3N_4$) is higher than that of silicon oxide ($SiO_2$). It is noted aluminum oxide ($Al_2O_3$) or other high-K material can be used in the multi-layer dielectric stack discussed above.

It is noted that use of a multi-layer top dielectric stack 130 (e.g. an ONO stack) provides better data retention qualities in non-volatile memory devices than use of a single dielectric layer.

In one embodiment, the multi-layer top dielectric stack 130 has a total EOT that is less than the thickness of the single bottom dielectric layer 126. For example, in one embodiment, the multi-layer top dielectric stack 130 can have an EOT of about 50 angstroms to about 90 angstroms, while the bottom dielectric layer 126 can have a thickness between about 70 angstroms and about 100 angstroms. In another embodiment, the multi-layer top dielectric stack 130 can have EOT of greater than 90 angstroms.

As is described more fully below, use of the multi-layer top dielectric stack provides numerous advantages, including, but not limited to, greater device scalability (e.g., reduced channel length), improved operating speed, and reduced operating voltage. In addition, the use of an electrically scaled down top dielectric stack alleviates short-channel effects (SCE) in the device, as well as, promotes enhanced data retention (i.e., stored or trapped charge retention).

The memory device 110 is operatively arranged to be programmed, verified, read, and erased by the application of appropriate voltage potentials to each of the wordline WL, which functions as the gate electrode 140, and the buried bitlines $BL_1$, $BL_2$, which each function as the source 114 or the drain 116, depending upon the desired operation.

In one embodiment, the memory device 110 can be configured as a virtual ground device. That is, during various operations of the memory device 110, either of the first bitline $BL_1$ or the second bitline $BL_2$ can function as a source 114 of electrons and either of the first bitline $BL_1$ or the second bitline $BL_2$ can be grounded or connected to a bias potential through bitline contacts (not shown).

As will become more apparent from the discussion below, within the charge trapping layer 128, the memory device 110 includes a first charge trapping region or cell 144 (also referred to herein as a normal cell, a first charge storing cell or normal bit) adjacent one of the conductive regions (e.g., the bitline $BL_2$) and a second charge trapping region or cell 146 (also referred to herein as a complementary cell, a second charge storing cell or complementary bit) adjacent the other conductive region (e.g., the bitline $BL_1$).

Each charge storing cell 144, 146 can independently have two data states. The data states can represent binary values, such as a logical zero and a logical one. The logical one, for example, can be implemented by leaving the desired charge storing cell 144, 146 in an unprogrammed state or blank programmed level. The logical zero, for example, can be implemented by storing an amount of charge in the desired charge storing cell 144, 146. This condition is also referred to as a charged state, a programmed state, a programmed level or a charged program level.

In the illustrated embodiment, the memory device 110 is a structurally symmetrical device, allowing for programming, verifying, reading, and erasing of the first charge storing cell 144 and the second charge storing cell 146 by respectively switching the roles of the bitlines $BL_1$, $BL_2$ (the source 114 and the drain 116) during those operations. Therefore, the bitlines $BL_1$, $BL_2$ will be referred to interchangeably by the terms source and drain, depending upon which of the normal bit 144 or the complementary bit 146 is being programmed, verified, read, or erased.

In one embodiment, the programming technique involves hot electron injection, also referred to as channel hot electron injection (CHE). However, it should be appreciated that modifications to the programming techniques can be made to accommodate variations in the specific memory device used.

Using hot electron injection, the first charge storing cell 144 can be programmed by applying a voltage potential (e.g., about +3 Volts to about +5 Volts) to the bitline $BL_2$ (functioning as the drain 116) and a reduced voltage potential of less than about +8 Volts to the wordline WL (functioning as the gate electrode 140). In one embodiment, a voltage potential of about +6 Volts to about +7.5 Volts can be applied to the wordline WL. It is noted that the above voltage potential is significantly lower than the conventional voltage potential of about +9 Volts to about +10 Volts applied to the wordline WL of modern devices during CHE programming. The other bitline $BL_1$ functions as the source 114 (i.e., source of electrons) for the CHE programming of the first charge storing cell 144. In one embodiment, a bias voltage potential is also applied to the source 114 (rather than grounding or floating the source as found in conventional charge trapping dielectric memory devices). As a result of the application of a biased potential to the source 114 during programming, greater control over electron injection can be accomplished, which leads to enhanced data retention capability of the memory device 110.

The voltages applied to the gate electrode 140, the source 114 and the drain 116 generate a vertical electric field through the bottom dielectric layer 126, the charge trapping layer 128, and the top dielectric stack 130 and a lateral electric field along the length of the channel 142 from the source 114 to the drain 116. At a given threshold voltage, the channel 142 inverts such that electrons are drawn off the source 114 and begin accelerating towards the drain 116. As the electrons move along the length of the channel 142, the electrons gain energy and, upon obtaining enough energy, the electrons jump over the potential barrier of the bottom dielectric layer 126 and into the charge storing layer 128, where the electrons become trapped.

As described above, the multi-layer dielectric stack 130 (e.g., ONO or OAO stack) of a given thickness provides an effective electrical thickness that is less than that of a single oxide layer of the same physical thickness. Therefore, if the EOT of the multi-layer dielectric stack (ONO or OAO) is less than the physical thickness of a single oxide layer, a lower voltage can be applied to the gate electrode 140 to achieve inversion of the channel 142. This means that a reduced wordline WL voltage can be employed for the CHE programming operation in devices with thinner EOT of the top multi-layer dielectric stack. In addition, this thinner overall dielectric stack under the wordline WL alleviates short-channel effects (SCE) in the cell, thus allowing for further device scaling.

The probability of electrons jumping the potential barrier is a maximum in the area of the first charge storing cell 144, adjacent the drain 116 (i.e., bitline $BL_2$), where the electrons have gained the most energy. The accelerated electrons are termed hot electrons and, once injected into the charge trapping layer, stay in the first charge storing cell 144 of the charge trapping layer 128. The trapped electrons tend not to spread laterally through the charge trapping layer 128 due to this layer's low conductivity and low lateral electric field therein. Thus, the charge remains localized in the charge trapping region of the first charge storing cell 144 close to the adjacent bitline $BL_2$.

The foregoing technique to program the first charge storing cell 144 can be used to program the second charge storing cell 146, but the functions of the bitlines $BL_1$ and $BL_2$ (i.e., source 114 and the drain 116) are reversed. However, as described above, a reduced wordline WL program voltage (e.g., less than about +8 Volts) can be employed.

In one embodiment, once one or both of the charge storing cells 144, 146 are programmed with stored charge, one or both of the charge storing cells 144, 146 can be erased using the technique of hot hole injection (sometimes referred to as band-to-band (BTB) hot hole injection).

While the memory device 110 can include an electrically scaled, multi-layer top dielectric stack 130, which facilitates reduced programming voltages and reduced SCE, the bottom dielectric layer 126 remains thick enough (e.g., about 70 angstroms to about 100 angstroms) to maintain desired data retention capabilities. In a hot hole injection erase, a negative voltage (e.g., about −3 Volts to about −5 Volts) is applied to the wordline WL, along with a drain 116 voltage on the order of about +4 Volts to about +5 Volts, while the source 114 is floated or grounded to erase the first charge storing cell 144. It is noted that the above wordline WL voltage potential is significantly lower than the conventional voltage potential of about −6 Volts to about −8 Volts applied to the wordline WL of modern devices during BTB hot hole erase. Conversely, the second charge storing cell 146 can be erased by floating the drain 116 and applying the above-referenced voltage potentials to the source 114 and the wordline WL.

Application of these potentials creates a BTB tunnel current under the gate. Holes are generated under these conditions and accelerated from the N-type drain 116 region into the P-type body 118. The generated holes are accelerated in the electric field created near the P-N drain/body junction. Some of the accelerated holes surmount the bottom-dielectric-to-silicon interface between the substrate 112 and the bottom dielectric layer 126 and are injected into the charge trapping layer 128 to displace electrons (e.g., by recombination), thereby erasing the cell.

It is noted that the rate of generation of the BTB holes is dependent on the vertical electric field near the P-N drain/body junction close to the interface between the substrate 112 and the bottom dielectric layer 126. If the EOT of the multi-layer top dielectric stack (e.g. ONO or OAO) is less than the physical thickness of a single top oxide layer, a lower voltage needs to be applied to the gate electrode 140 to achieve the vertical electric field necessary for sufficient BTB hot hole generation during the BTB hot hole erase operation. This means that a reduced wordline WL voltage can be employed for the BTB hot hole erase operation in devices with thinner EOT of the top multi-layer dielectric stack.

In another embodiment, once one or both of the charge storing cells 144, 146 are programmed with stored charge, both of the charge storing cells 144, 146 can be erased using the technique of Fowler-Nordheim (FN) tunneling. However, it should be appreciated that modifications to the erasing techniques can be made to accommodate variations in the specific memory device used.

To erase both charge storing cells 144 and 146 by the FN tunneling erase technique either (i) a negative voltage (e.g., about −12 Volts to about −15 Volts) can be applied to the wordline WL 140, while drain 116, source 114, and substrate 112 are grounded or (ii) a negative voltage of about −8 Volts to about −10 Volts can be applied to the wordline to the WL 140, while applying a potential of about +4 Volts to about +6 Volts to substrate 112, drain 116, and source 114. It is noted that the above wordline WL voltage potentials are significantly lower than the conventional voltage potentials of either (i) about −15 Volts to about −20 Volts or (ii) about −10 Volts to about −12 Volts, respectively, applied to the wordline WL of modern devices during FN tunneling erase.

Application of these potentials creates FN tunnel current under the gate. Electrons tunnel from the charge trapping layer 128 through the bottom dielectric layer 126 to substrate 112, drain 116, and source 114, thereby erasing the cell.

It is noted that the probability of FN tunneling of electrons from the charge trapping layer is dependent on the vertical electric field inside the bottom dielectric layer. If the EOT of the multi-layer top dielectric stack (e.g. ONO or OAO) is less than the physical thickness of a single top oxide layer, a lower voltage can be applied to the gate electrode 140 to achieve the vertical electric field necessary for efficient FN tunneling during the erase operation. This means that a reduced wordline WL voltage can be employed for the FN tunneling erase operation in devices with thinner EOT of the top multi-layer dielectric stack.

With continued reference to FIG. 2, one method of fabricating the memory device 110 will described in greater detail. The method can begin by providing the semiconductor substrate 112. The semiconductor substrate 112 can be initially doped with P-type dopant (e.g., by implanting boron ions, gallium ions or indium ions). As indicated above, the initial substrate 112 doping can provide the desired conductivity for the body 118.

A layer of material used to form the bottom dielectric layer 126 can be grown or deposited on top of the substrate 112. In one embodiment, the bottom dielectric layer 126 can have a final thickness of about 70 angstroms to about 100 angstroms. As indicated above, the thickness of the bottom dielectric layer 126 remains thick enough to prevent low voltage leakage current and provide desirable data retention for use with the hot hole injection erase operation described above. It is noted that the bottom dielectric layer 126 can optionally be used as an implant screen during the implantation of dopant species into the substrate 112. In this instance, the bottom dielectric layer 126 can be formed before initial substrate 112 implantation.

As indicated above, the bottom dielectric layer 126 can be formed from an appropriate dielectric material such as a thermal oxide layer made from silicon oxide (e.g., $SiO_2$), or a high-K material. High-K materials are materials having, in one embodiment, a relative permittivity of ten or higher and, in another embodiment, of twenty or higher. Although other high-K materials can be selected, hafnium oxide (e.g., $HfO_2$), zirconium (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$), and barium strontium titanate (e.g., BST) are suitable high-K materials. In addition, all binary and ternary metal oxides and ferroelectric materials having a K higher than, in one embodiment, above about twenty can be used for the bottom dielectric layer 126.

Following formation of the bottom dielectric layer 126, a layer of material used to form the charge trapping layer 128 can be formed on the bottom dielectric layer 126. In one embodiment, a charge trapping layer 128 can be formed from silicon nitride (e.g. $Si_3N_4$). Other suitable dielectric materials may also be used for the charge trapping layer 128. In one embodiment, the charge trapping layer 128 can have a final thickness of about 50 angstroms to about 80 angstroms.

On top of the charge trapping layer 128, the multi-layer top dielectric stack 130 can be formed. The top dielectric stack 130 can include a first dielectric layer 132, which can be made from an appropriate dielectric, such as a silicon oxide (e.g., $SiO_2$) or a suitable high-K material. The top dielectric stack 130 can include a second dielectric layer 134 over the first dielectric layer 132. The second dielectric layer can be made from an appropriate dielectric, such as silicon nitride ($Si_3N_4$) or aluminum oxide ($Al_2O_3$). The top dielectric stack 130 can include a third dielectric layer 136, which can be formed from the same material used for the first dielectric layer 132. In one embodiment, the first dielectric layer 132 has a thickness of about 10 angstroms to about 30 angstroms, the second dielectric layer 134 has a thickness of about 30 angstroms to about 50 angstroms, and the third dielectric layer 136 has a thickness of about 10 angstroms to about 30 angstroms. The first dielectric layer 132 and the third dielectric layer 136 can be formed, for example, by HTO (high temperature oxidation) or TEOS (tetra-ethyl-ortho silicate).

In one embodiment, top dielectric stack 130 consists of an ONO or an OAO stack having a final thickness of about 50 angstroms to about 90 angstroms, which can provide a critical dimension for reducing short channel effects (SCE) and allowing for a lower operating or programming voltage (e.g., less than about +8 Volts) to be applied to the gate electrode 140. As described above, these advantages are enjoyed due to the reduced effective electrical thickness of the top dielectric stack 130.

On top of the top dielectric stack 130, a gate electrode layer 140 can be formed. The gate electrode layer 140 can be made from, for example, polycrystalline silicon (poly) or another appropriate material, such as a metal or metal oxide. In one embodiment, the gate electrode 140 can have a thickness of about 500 angstroms to about 3,000 angstroms.

The bottom dielectric layer 126, the charge trapping layer, 128, the top dielectric stack 130 and, optionally, the gate electrode layer 140 can be uniformly formed across the substrate 112 in an area used to form a core array of memory devices 110. After the layers 126, 128, 130, and 140 have been formed, these layers can be patterned to form stacked gates. The patterning step can also be referred to as a bitline mask and etch step. A mask layer can be formed from, for example, a photoresist that is patterned using photolithographic techniques. The mask layer can be patterned into a series of lines and spaces where the lines cover the layers 126, 128, 130 and 140, where the stack gates are formed, and the spaces expose the layers 126, 128, 130, and 140, where the bitlines $BL_1$, $BL_2$ will be formed.

The layers 126, 128, 130, and 140 can be etched in areas left exposed by the mask layer to expose the substrate 112. In an alternative embodiment, the bottom dielectric layer 126 is left in place as an implant screen.

Once the patterning and/or etching process is complete, an ion or dopant implantation process is carried out to form the buried bitlines $BL_1$, $BL_2$. In one embodiment, the buried bitlines are formed by the dopant implantation of an N-type dopant species (e.g., ions such as antimony, phosphorous or arsenic). It is to be appreciated that the stacked gate can function as a self-aligned mask for the dopant implantation.

In one embodiment, the buried bitlines $BL_1$, $BL_2$ are formed with sufficient N-type dopant implanted to provide $N^+$ conductivity. For example, in one embodiment, arsenic for ion species can be implanted with a energy of about 40 keV to about 50 keV and a dose of about 1 e 15 atoms/cm$^2$ to about 2 e 15 atoms/cm$^2$. If desired, an anneal cycle, such as a rapid thermal anneal (RTA) can be carried out to activate the dopant species of the buried bitlines $BL_1$, $BL_2$. The implantation energy can be of sufficient magnitude that the buried bitlines have a depth of at least 100 angstroms. It is noted that the dopant species may diffuse under the stacked gate during one or more subsequent anneal cycles to which the memory device 110 is subjected. Any such diffusion can be accounted for or otherwise controlled by controlling the implant energy, the implant dose, the anneal cycle parameters, pre-amorphization parameters and the like.

Sidewall spacers, if applicable, can be formed. The sidewall spacers can be formed adjacent the lateral sidewalls of the stacked gate using a variety of techniques. For example, a layer of desired spacer material (e.g., silicon nitride, silicon oxide, silicon oxynitride, etc.) can be deposited to at least the height of the stacked gate. If desired, the spacer material can be polished (using, for example, chemical, mechanical planarization or CMP) back to an upper surface of the gate electrode 140. Then, the spacer material can be anisotropically etched so that the sidewall spacers remain. Next, the region above the buried bitlines $BL_1$, $BL_2$ can be filled with an appropriate dielectric material forming an interlayer dielectric such as ILD-0).

Thereafter, in one embodiment, the wordline WL can be formed. For example, a layer of polysilicon can be formed over the top dielectric stack 130 (or, optionally, over the already-existing gate electrode layer 140). The layer of polysilicon can etched into individual wordlines WL using a protective mask that is patterned using a photolithographic process. At this point, dielectric material or a second interlayer dielectric (e.g., ILD-1) can optionally be formed between wordlines WL. Thereafter, any additional processing to complete the formation of the memory device 110 can be carried out. Such processing can include formation of bitlines and/or wordline contact, any additional dielectric layers, conductive layers, interconnect layers and so forth using conventional techniques.

Figure 3:
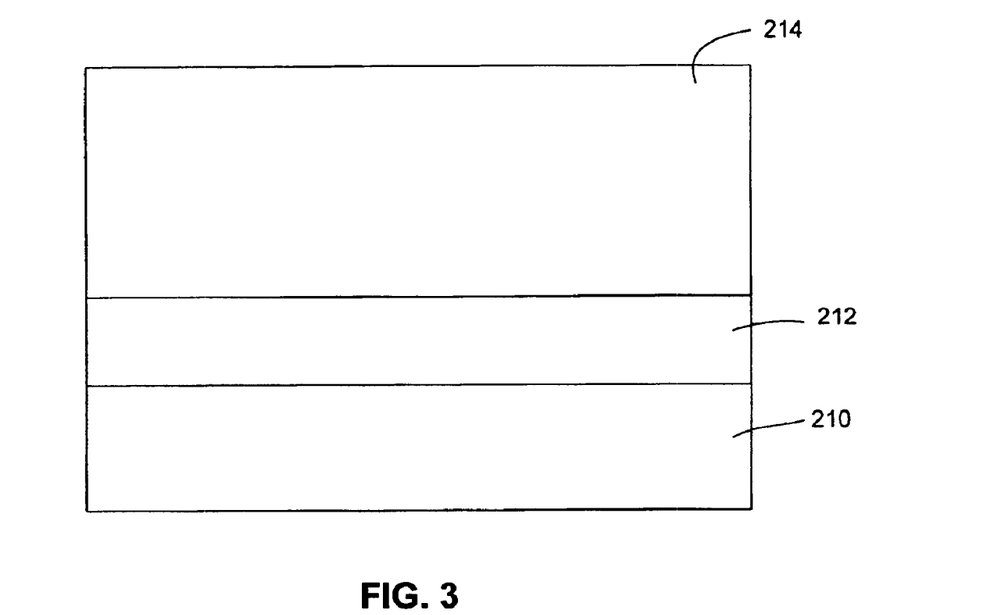
FIGS. 3–6 illustrate side cross-sectional views of fabricating steps in accordance with one embodiment of the present invention.

With reference now to FIGS. 3–6, another method of fabricating the memory device will be described in greater detail. As shown in FIG. 3, the method can begin by providing a semiconductor substrate 210. The semiconductor substrate 210 can be initially doped with P-type dopant (e.g., by implanting boron ions, gallium ions or indium ions). A second semiconductor layer 212 can be provided and implanted, for example, with N-type dopant (e.g., $N^+$ dopant concentration). A thick dielectric layer 214, such as, silicon oxide (e.g., $SiO_2$) can be deposited or otherwise grown over the $N^+$ semiconductor layer 212.

Figure 4:
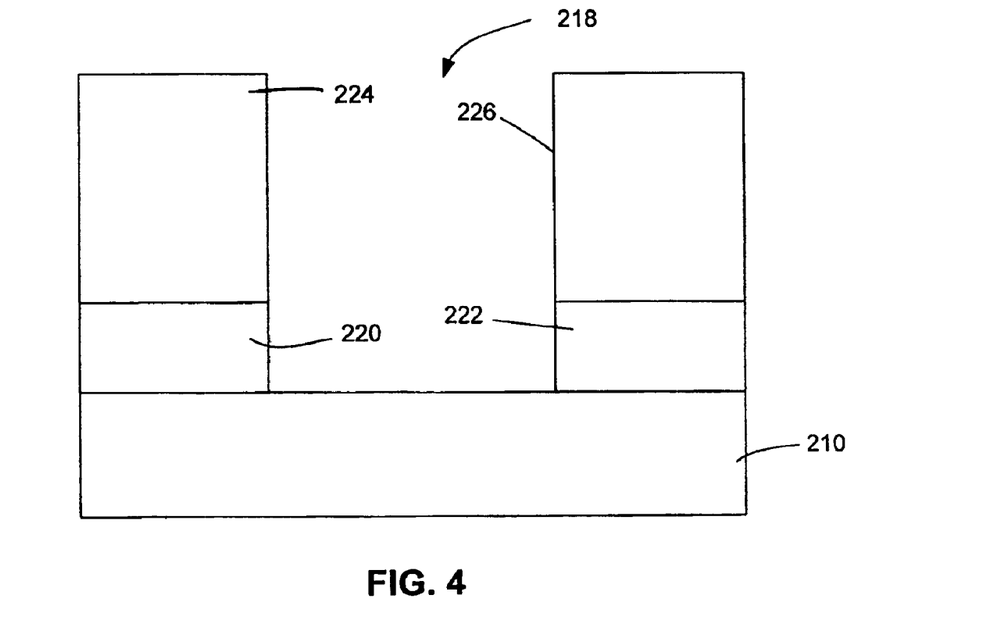

As shown in FIG. 4, a trench 218 can be etched through both the oxide layer 214 and the $N^+$ semiconductor layer 212, thereby providing a pair of $N^+$ semiconductor regions 220, 222 and a pair of oxide regions 224, 226 disposed above the $N^+$ semiconductor regions 220, 222. It is to be appreciated that $N^+$ semiconductor areas 220, 222 will serve as the bitlines for the memory device.

Figure 5:
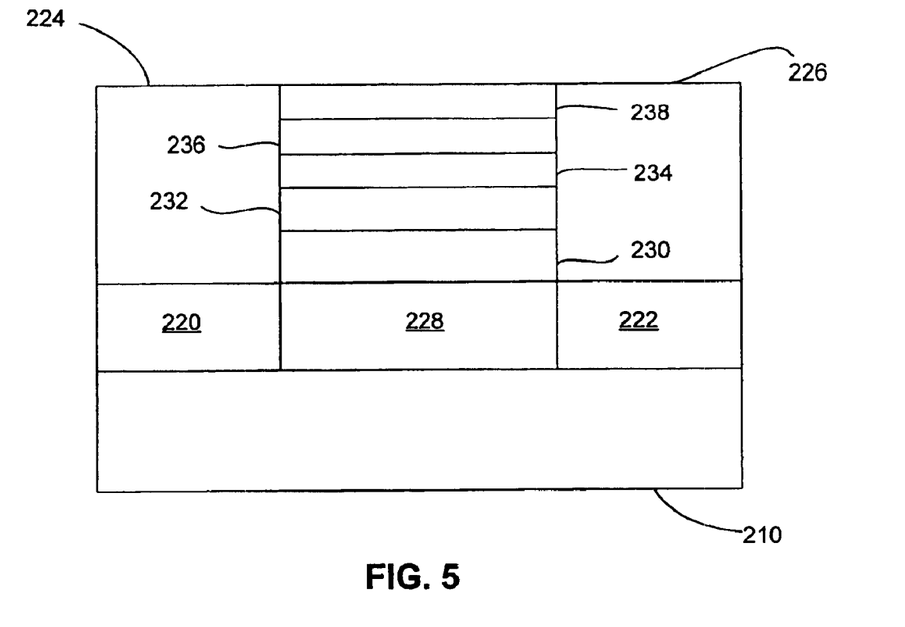

As shown in FIG. 5, a multi-layer dielectric stack, such as is described more fully above, can be deposited within the trench 218 as shown. More particularly, in one embodiment, a first dielectric layer 230 can be deposited, followed by a second dielectric layer 232 (e.g., a silicon nitride charge trapping layer), followed by an oxide-nitride-oxide top dielectric stack (layers 234, 236, 238) can be deposited within the trench, as shown.

Figure 6:
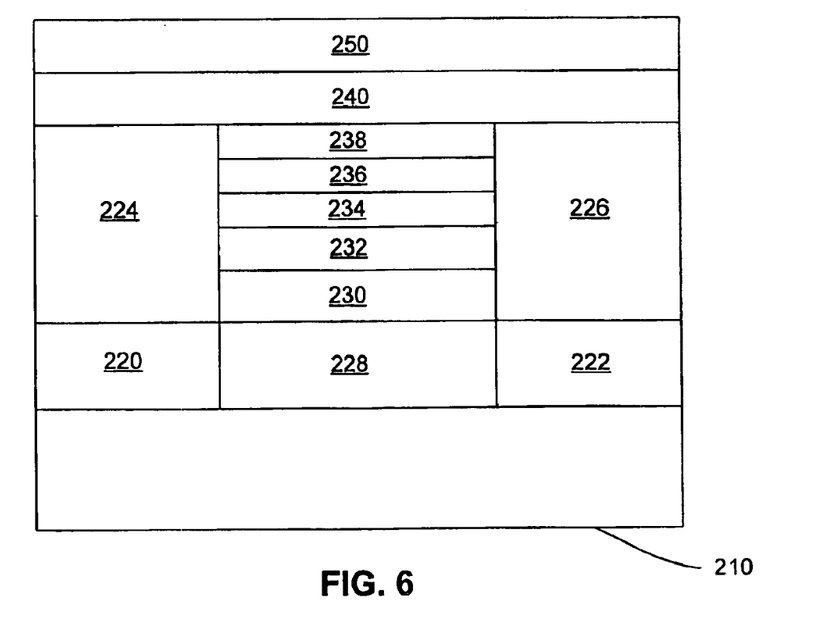

As shown in FIG. 6, a polysilicon wordline 240, which functions as a gate electrode, can be deposited over the multi-layer dielectric stack. Next, the device can be covered with an additional dielectric layer 250, such as a silicon oxide layer (e.g., $SiO_2$), which is then planarized, using conventional techniques.

Of course, it is to be appreciated that the method described above can be used to form memory devices having dielectric stacks with greater or fewer layers than what is described herein.

Figure 7:
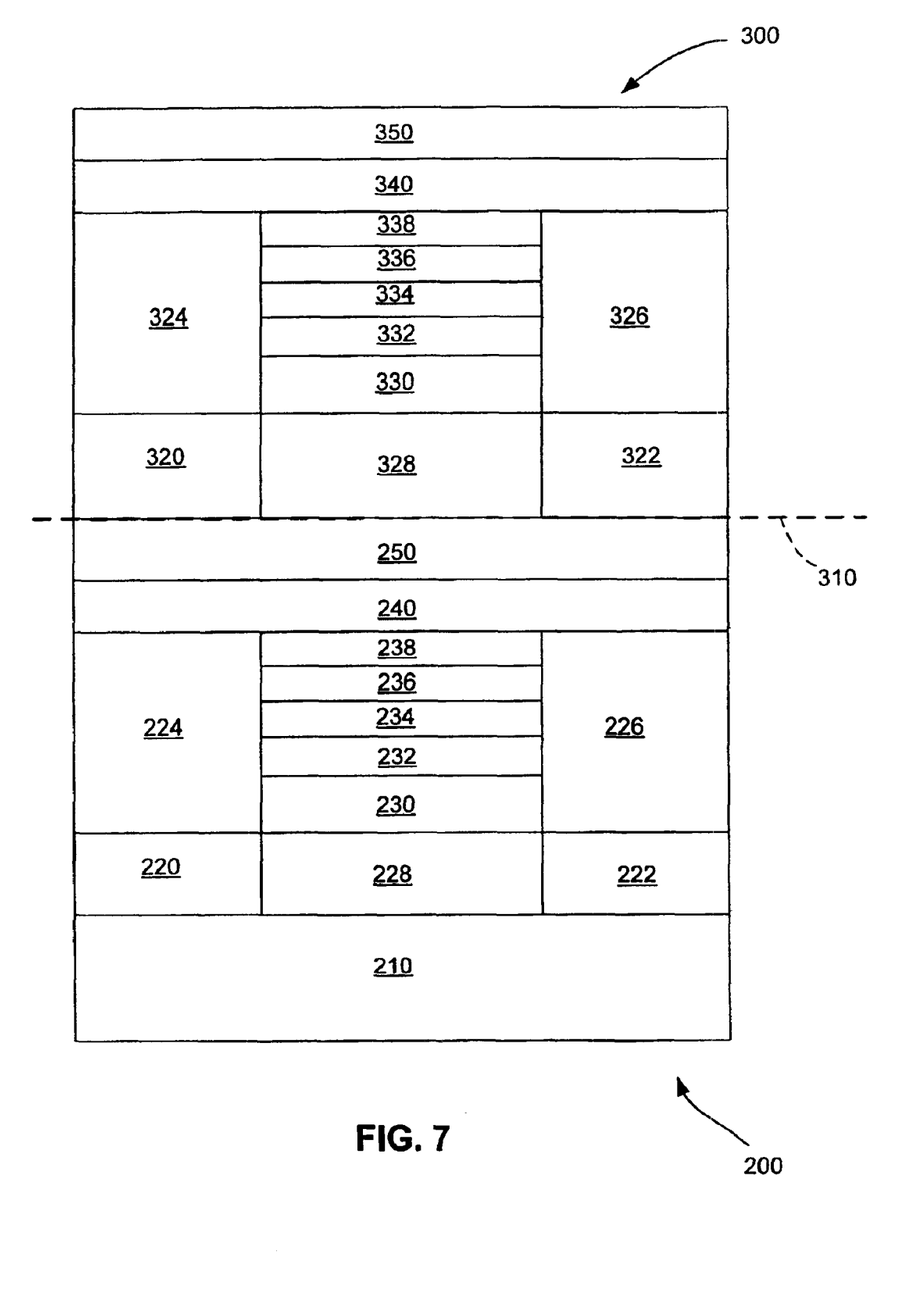
FIG. 7 is a schematic cross-section illustration of a flash memory device having stacked memory cells in accordance with one embodiment of the present invention.

With reference to FIG. 7, it is to be appreciated that after the planarization step described above, the process illustrated in FIGS. 3–6 can be repeated, resulting in a multi-layer memory device structure, as shown. In particular, in accordance with this embodiment, the multi-layer memory device can include at least two memory cells 200, 300 disposed in a vertically adjacent or stacked relationship to one another (as shown with respect to dashed line 310). It is to be appreciated that like elements of memory cells 300 are illustrated using reference numerals, which are increased by 100 relative to the reference numerals used for the corresponding elements of memory cell 200.

As should be apparent, the foregoing methods can be modified as desired to form desired properties of the memory device. For instance, the order of steps can be modified, certain steps can be omitted and/or additional steps can be added. In addition, the specified materials, dopant parameters and so forth can be modified.

Although, particular embodiments of the invention have been described in detail, it is understood that the invention is not limited correspondingly in scope, but includes all changes, modifications, and equivalents.

What is claimed is:

1. A memory device comprising:
    a substrate having a first semiconductor bitline and a second semiconductor bitline formed therein and a body region interposed between the first and second bitlines;
    a bottom dielectric layer disposed over the body region;
    a non-conductive charge trapping layer disposed over the bottom dielectric layer, said non-conductive charge trapping layer being operatively configured to have at least two independent charge storing regions;
    a top dielectric stack disposed over the non-conductive charge trapping layer, said top dielectric stack including at least three dielectric layers; and
    a wordline disposed over the top dielectric stack and electrically defining a channel within the body region.

2. The memory device according to claim 1, wherein the top dielectric stack has a thickness of about 50 angstroms to about 90 angstroms.

3. The memory device according to claim 1, wherein the top dielectric stack includes:
    a first oxide layer disposed over the charge trapping layer;
    at least one of (i) a nitride layer and (ii) an aluminum oxide layer disposed over the first oxide layer; and
    a second oxide layer disposed over the at least one of (i) a nitride layer and (ii) aluminum oxide layer.

4. The memory device according to claim 3, wherein the first and second oxide layers are silicon dioxide.

5. The memory device according to claim 3, wherein:
    the first oxide layer has a thickness of about 10 angstroms to about 30 angstroms;
    the at least one of (i) a nitride layer and (ii) an aluminum oxide layer has a thickness of about 30 angstroms to about 50 angstroms; and
    the second oxide layer has a thickness of about 10 angstroms to about 30 angstroms.

6. The memory device according to claim 3, wherein the top dielectric stack has a physical thickness greater than a thickness of the bottom dielectric layer and an electrical thickness that is less than an electrical thickness of the bottom dielectric layer.

7. The memory device according to claim 6, wherein:
    the charge trapping layer has a conductivity such that at least a first charge can be stored in a first charge trapping cell adjacent the second bitline and at least a second charge can be stored in a second charge trapping cell adjacent the first bitline; and
    the top dielectric stack is effective to increase the probability that charge will be stored in at least one of the first and second charge trapping cells upon application of a voltage potential of less than about +8 Volts to the wordline.

8. A method of programming the memory device according to claim 6, said method including:
    applying a program voltage of less than about +8 Volts to the wordline;
    applying a voltage potential of about +3 Volts to about +5 Volts to the first bitline; and
    one of (i) connecting the second bitline to a zero potential, and (ii) floating the second bitline.

9. The memory device according to claim 6, said memory device being operative to be erased by a hot hole injection erase operation.

10. A memory device comprising:
    a semiconductor substrate;
    a source and a drain formed from buried bitlines disposed within the semiconductor substrate, said source and drain defining a body region therebetween;
    a charge trapping dielectric stack having at least 5 dielectric layers formed over the body region and including a non-conductive charge trapping layer; and
    a gate electrode formed from a wordline disposed over the charge trapping dielectric stack, said gate electrode electrically defining a channel within the body region.

11. The memory device according to claim 10, wherein the charge trapping dielectric stack includes:
    a first dielectric layer disposed over the body region;
    a charge trapping dielectric layer disposed over the first dielectric layer;
    a second dielectric layer disposed over the charge trapping dielectric layer;
    a third dielectric layer disposed over the second dielectric layer; and
    a fourth dielectric layer disposed over the third dielectric layer.

12. The memory device according to claim 11, wherein the charge trapping dielectric layer and the third dielectric layer are comprised of a nitride material; and
    the first, second and fourth dielectric layers are comprised of an oxide material.

13. The memory device according to claim 10, wherein the charge trapping dielectric stack includes:
    a bottom dielectric layer formed over the body region;
    a charge trapping dielectric layer formed over the bottom dielectric layer; and
    a top dielectric stack formed over the charge trapping dielectric layer.

14. The memory device according to claim 13, wherein the top dielectric stack includes:
    a first oxide layer formed over the charge trapping dielectric layer;
    at least one of (i) a nitride layer and (ii) an aluminum oxide layer formed over the first oxide layer; and
    a second oxide layer formed over the nitride layer.

15. The memory device according to claim 14, wherein the top dielectric stack has a thickness of about 50 angstroms to about 90 angstroms.

16. The memory device according to claim 14, wherein the top dielectric stack has an electrical thickness less than an electrical thickness of the bottom dielectric layer.

17. The memory device according to claim 13, wherein:
    the charge trapping dielectric layer has a conductivity such that at least a first charge can be stored in a first charge trapping cell adjacent the drain and at least a second charge can be stored in a second charge trapping cell adjacent the source; and
    the top dielectric stack is effective to increase the probability that charge will be stored in at least one of the first and second charge trapping cells upon application of a voltage potential of less than about +8 Volts to the gate electrode.

18. A method of programming the memory device according to claim 13, said method including:

applying a program voltage of less than about +8 Volts to the gate electrode;

applying a voltage potential of about +3 Volts to about +5 Volts to the drain; and one of (i) connecting the source to a zero potential, and (ii) floating the source.

19. A method of erasing the memory device according to claim 13, said method including:

applying an erase voltage of about −12 Volts to about −15 Volts to the gate electrode; and connecting the substrate, the source and the drain to a zero potential.

20. A method of programming a non-volatile memory device having a pair of buried bitlines disposed within a semiconductor substrate, said buried bitlines defining a body region therebetween, a bottom dielectric layer formed over the body region, a charge storing layer formed over the bottom dielectric layer, said charge storing layer having a conductivity such that at least a first charge can be stored in a first charge storing cell adjacent a first buried bitline and at least a second charge can be stored in a second charge storing cell adjacent a second buried bitline, a top dielectric stack including at least three dielectric layers formed over the charge storing layer, and a wordline formed over the top dielectric layer, said method comprising:

applying a program voltage of about +6 Volts to about +7.5 Volts to the wordline;

applying a voltage potential of about +3 Volts to about +5 Volts to the first bitline; and connecting the second bitline to a zero potential.

* * * * *